United States Patent [19]

Sud et al.

[11] 4,346,459
[45] Aug. 24, 1982

[54] REDUNDANCY SCHEME FOR AN MOS MEMORY

[75] Inventors: Rahul Sud, Colorado Springs; Kim C. Hardee, Manitou Springs; John O. Heightley, Monument, all of Colo.

[73] Assignee: INMOS Corporation, Colorado Springs, Colo.

[21] Appl. No.: 164,282

[22] Filed: Jun. 30, 1980

[51] Int. Cl.³ .................. G11C 8/00; G11C 29/00; G11C 11/40
[52] U.S. Cl. ........................................ 365/200; 371/10
[58] Field of Search ................... 365/200, 201; 371/10

[56] References Cited

U.S. PATENT DOCUMENTS 4,250,570 2/1981 Tsang et al. ..................... 365/200

Primary Examiner—Stuart N. Hecker
Attorney, Agent, or Firm—John H. Moore

[57] ABSTRACT

A redundancy scheme is described for use with an MOS memory having a main array of memory cells, and a plurality of spare memory cells. Typically, each memory cell is tested for operability by a conventional probe test. When a defective memory cell is found, an on-chip address controller responds to the probe test finding a defective cell by permanently storing and rendering continuously available a fully asynchronous electrical indication of the address of the defective cell. The address controller compares its stored data with memory cell information received during normal memory operation, and generates a control signal indicative of the receipt of an address which corresponds to a defective cell. A spare cell selector responds to the control signal by electrically accessing a spare memory cell and by prohibiting access of the defective memory cell.

22 Claims, 7 Drawing Figures

REDUNDANCY SCHEME FOR AN MOS MEMORY

BACKGROUND OF THE INVENTION

This invention relates generally to MOS (metal oxide semiconductor) memories, and is particularly directed to a high speed, low power RAM (random access memory) having a redundancy scheme for replacing defective memory cells with spare memory cells.

MOS memories generally include a memory array in the form of rows and columns of memory cells for storing digital data. In a typical memory, there may be more than sixteen thousand individual memory cells, each of which must function properly. A single inoperative memory cell destroys the usefulness of the memory and, therefore, lowers the yield of the wafer on which many memories are simultaneously manufactured.

To increase the yield of each wafer, it has been proposed to include spare memory cells in each chip. Thus, if a memory cell is found to be defective during testing by the manufacturer, a spare memory cell is selected to replace the defective memory cell.

Some prior schemes for selecting spare memory cells have included the use of fuses which are embodied in each chip in such a way that blowing a fuse with a laser beam causes a defective cell to be replaced by a spare cell.

In some other schemes for selecting a spare memory cell, a fuse is blown electrically in response to an externally derived test signal during probe test and a simultaneous low level signal at an address input. The latter signal is typically coupled directly to the fuse via a transistor such that the current required to blow the fuse passes through the transistor to the address input. Hence, the address input must be able to draw current in order to blow the fuse and this places undesirable current handling restraints on the test equipment which applies test signals to the address inputs. In addition, the above-mentioned transistor suffers from a lack of input protection.

Electrical fuse-blowing schemes of the type described above typically require external clock pulses to gate the fuse information to additional sensors which, in turn, generate address information identifying the defective cells. The time required to generate the address information relating to the defective memory cells adds to the time required to complete a read or write operation.

Another drawback of prior redundancy schemes, both of the laser fuse-blowing type and the electrical fuse-blowing type, is that they tend to be complex. A more desirable redundancy scheme would not only blow the fuses electrically, but would use less complex on-chip circuitry which imposes no access time penalty and which dissipates very little chip power.

OBJECTS OF THE INVENTION

It is a general object of the invention to provide an improved redundancy scheme for an MOS memory.

It is a more specific object of the invention to provide a redundancy scheme which embodies on-chip memory selection fuses which are adapted to be blown electrically during a chip test procedure such that the scheme imposes neither undue current handling requirements on the test equipment nor input protection limitations on transistors which carry the current required to blow the fuses.

It is a further object of the invention to provide such a redundancy scheme which employs relatively simple redundancy circuitry, which does not inhibit memory access time, which dissipates very little chip power, and which is particularly adaptable for use with N-channel MOS memories.

BRIEF DESCRIPTION OF THE FIGURES

The objects stated above and other objects of the invention are set forth more particularly in the following detailed description and in the accompanying drawings, of which.

SUMMARY OF THE INVENTION

A redundancy scheme is described for use with an MOS memory having a main array of memory cells, and a plurality of spare memory cells. Typically, each memory cell is tested for operability by a conventional probe test. When a defective memory cell is found, an on-chip address controller responds to the probe test finding a defective cell by permanently storing and rendering continuously available a fully asynchronous electrical indication of the address of the defective cell. The address controller compares memory cell information received during normal memory operation with its stored data, and generates a control signal indicative of the receipt of an address which corresponds to a defective cell. A spare cell selector responds to the control signal by electrically accessing a spare memory cell and by prohibiting access to the defective memory cell.

DESCRIPTION OF THE PREFERRED EMBODIMENT

A 16K MOS static RAM is described to illustrate the application of the present redundancy scheme. A similar RAM is disclosed in U.S. application Ser. No. 164,283, filed June 30, 1980, and the pertinent teachings thereof are incorporated herein by reference in order to omit details in this description which are not necessary for an understanding of the present invention. Suffice it to say that the RAM is an integrated circuit which may be fabricated by conventional processes on a P-type silicone substrate, and employs N channel field effect transistors having polysilicon gates. The memory is TTL compatible, and is organized as a pair of $64 \times 128$ memory cell arrays.

Figure 1:
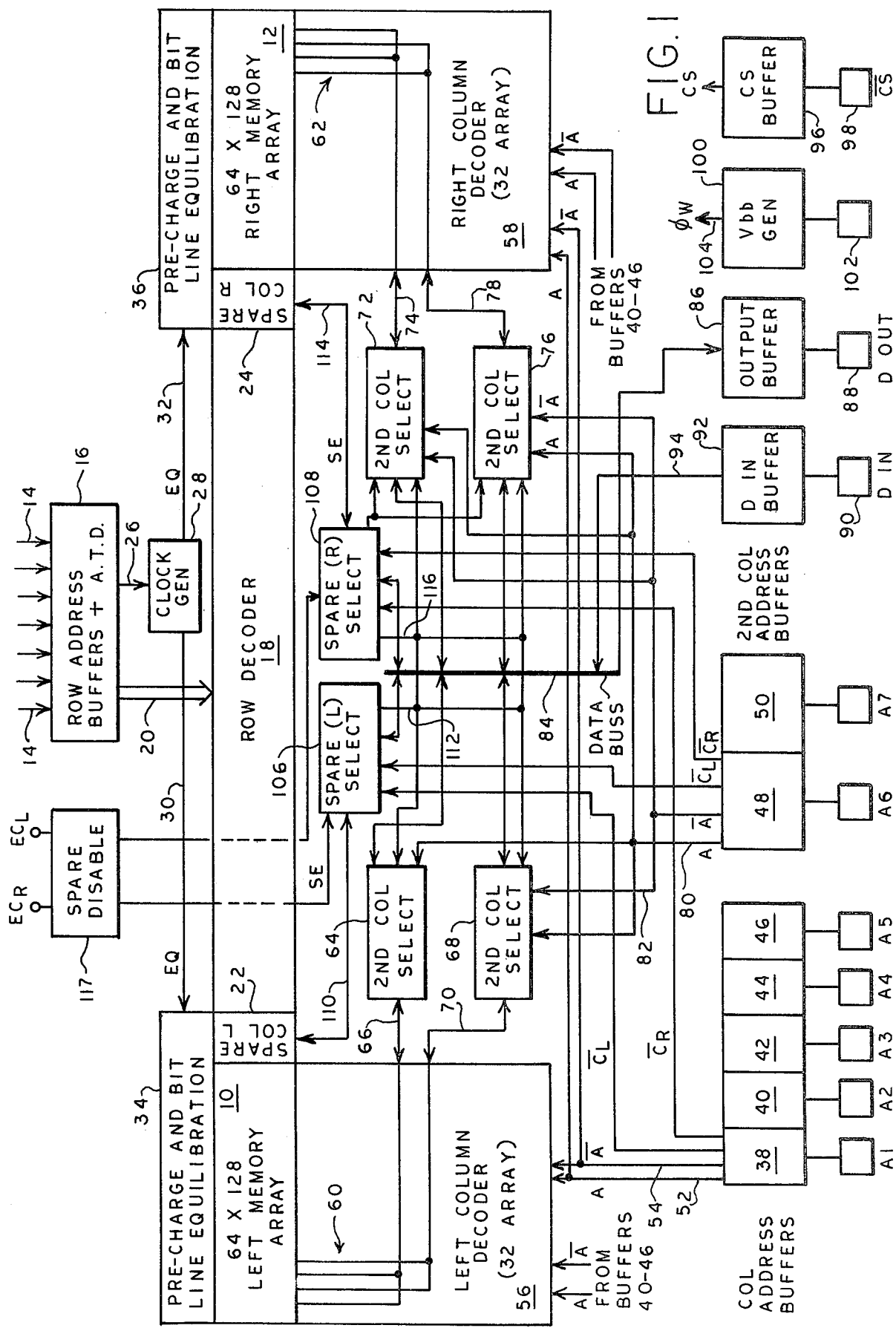
FIG. 1 is a block diagram illustrating the architecture of an exemplary 16K RAM which employs the present redundancy scheme.

Referring now to FIG. 1, a block diagram is shown which depicts the architecture of the chip. This diagram is similar to that shown in the above-mentioned application except that some details have been omitted or simplified, and others have been elaborated on to facilitate the description of the present invention.

As shown in FIG. 1, the memory array includes a left array of cells 10 and a right array of cells 12. Each of the arrays includes 64 columns by 128 rows of memory cells. To access any one of the cells, externally generated row and column address bits are applied to the RAM and decoded to enable a particular column select line (bit lines) and row select line (word line). The intersection of the enabled word line and the enabled bit lines locates the memory cell to which access is sought by the row and column address bits.

In the illustrated embodiment, seven row address bits are applied to input leads 14 for receipt by an equal number of row address buffers 16. Each of the buffers generates true and complimentary row address data in response to the input bits for driving a row decoder 18 via a buss 20. Thus, seven pairs of true and complimentary row address data are applied to the buss 20, and the decoder 18, which may be conventional, decodes the row address data for enabling a particular word line (not shown) in the left memory array 10, in the right memory array 12, and in a pair of spare columns 22 and 24 which each contain a spare column of memory cells.

Each of the row address buffers 16 also includes an address transition detector (A.T.D.) for sensing a change in the row address information at leads 14. When such a change is sensed, a pulse is developed on a lead 26 for activating a clock generator 28. When enabled, the generator 28 outputs a control pulse EQ on leads 30 and 32 for activating pre-charge and bit line equilibration circuits 34 and 36. The operation of the address transition detectors, the clock generator 28 and the precharge and bit line equilibration circuits 34 and 36 is described in detail in the patent application mentioned above and is not directly related to the present invention. Suffice it to say that the effect of the latter circuits is to pre-charge and equilibrate all bit lines in the memory arrays 10 and 12 and in the spare columns 22 and 24 whenever a change occurs in row address information.

To enable selected bit lines, the RAM includes seven input pins A1–A7, each of which receives a bit of column address information. The information received by pins A1–A5 is applied to five column address buffers 38–46, and the information received by pins A6 and A7 is applied to a pair of second column address buffers 48 and 50.

One of the functions of the buffers 38–50 is to develop true (A) and complimentary ($\overline{A}$) column address data for application to column decoder circuitry. For example, the buffer 38 develops A and $\overline{A}$ outputs on leads 52 and 54, respectively, for application to a left column decoder 56 and to a right column decoder 58. Each of the other buffers 40–46 also develops A and $\overline{A}$ outputs which are similarly coupled to the column decoders 56 and 58. The connections between the latter buffers and the column decoders is omitted from FIG. 1 to simplify the drawing.

Generally, the A and $\overline{A}$ outputs of the buffers 38–46 cause the left column decoder 56 and the right column decoder 58 to access two columns of memory cells in the left memory array 10 via four bit lines 60 and to access two columns of memory cells in the right memory array 12 via four additional bit lines 62. The data on two of the bit lines from the left memory array 10 is coupled to a second column select (decoder) 64 via data lines 66 and the data on the other two bit lines is coupled to another second column select 68 via data lines 70.

Similarly, the data on two of the bit lines 62 from the right memory array is coupled to a second column select 72 via data lines 74 and the data on the other two bit lines is coupled to another second column select 76 via data lines 78.

The second column selects 64, 68, 72 and 76 are enabled by the second column address buffers 48 and 50. For example, the buffer 48 responds to the address bit at pin A6 for developing true (A) and complimentary ($\overline{A}$) column address data at leads 80 and 82, respectively. The data on the latter leads is input to each of the second column selects are shown. The buffer 50 also generates A and $\overline{A}$ outputs for application to the four second column selects.

In response to the A and $\overline{A}$ data, the second column selects 64, 68, 72 and 76 couple one of the data line pairs 66, 70, 72 or 76 to a data buss 84. Thus, the four second column selects couple to the data buss 84 only data from one of the four memory columns selected by the left and right column decoders. The information thus received by the buss 84 may be coupled to an output buffer 86 for coupling the output data to a pin 88.

To write data into memory, a pin 90 is provided for supplying input data to an input buffer 92. The data output of the buffer 92 is coupled to the data buss 84 via a lead 94. The data on the buss 84 is written into memory by accessing a particular memory cell in the manner described above.

The RAM may also include a chip select (CS) buffer 96 for receiving an externally generated chip select signal ($\overline{CS}$) at a pin 98. The chip select (CS) output of the buffer 96 may be applied to various decoders and buffers in the RAM to switch it from an active mode to a standby mode, and vice versa, in a conventional manner.

In addition, a $V_{bb}$ generator 100 may be included for generating a substrate bias voltage at a pin 102 and a 5 megahertz square wave signal $\phi W$ at lead 104. The signal $\phi W$ may be used in a number of the circuits in FIG. 2, an example of which is described hereinafter. The construction of the $V_{bb}$ generator may be conventional or as described in U.S. application Ser. No. 164,284 filed June 30, 1980.

Referring again to the column address buffers 38–50, each of them provides a function in addition to buffering for implementing the redundancy scheme. Specifically, each of the buffers 38–50 includes an address controller in the form of fuse circuits for storing data indicative of whether a memory cell is defective, and a comparator for comparing the column address input data with the stored or "fused" data. When such a comparison by each of the buffers 38–50 indicates that the column attempted to be addressed contains a defective memory cell, those buffers generate signals $\overline{CL}$ or $\overline{CR}$ for enabling a left spare select 106 or a right spare select 108. For example, the buffers 38 and 48 are shown as each having outputs identified as $\overline{CL}$ and $\overline{CR}$. Each $\overline{CL}$ output forms an input to the left spare select 106 and each $\overline{CR}$ output forms an input to the right spare select 108. Each of the buffers 40–46 and 50 has a $\overline{CL}$ and a $\overline{CR}$ output (not shown) which is similarly coupled to the spare selects 106 and 108. As described in more detail hereinafter, when all the $\overline{CL}$ outputs are low, the left spare select 106 is enabled, and generates a selection signal (SE) on lead 110 for accessing the memory cells in the left spare column 22. In addition, the enabled spare select 106 generates a signal at lead 112 for disabling the second column selects 64 and 68 as well as the second column selects 72 and 76.

Similarly, when all the CR outputs are low, the right spare select 108 is enabled and generates a selection signal (SE) on lead 114 for accessing the memory cells in the right spare column 24. In addition, a disable signal is generated on lead 116 for disabling the four second column selects so that data from the defective column cannot interfere with the data from the spare column. Such disabling of the second column selects is needed because the column address buffers 38-50 are generating A and $\overline{A}$ outputs almost simultaneously with their generation of their $\overline{CL}$ and $\overline{CR}$ outputs.

As described in detail hereinafter, a spare column is accessed only if, during a test procedure, a defective cell or column of cells was located in either the left memory array 10 or the right memory array 12. If no defective memory cell is found, a spare disable circuit 117 permanently disables the spare selects 106 and 108 in response to signals $EC_R$ and $EC_L$ which are developed by an independent probe test during chip testing.

Before proceeding with a detailed description of the fuse and comparison circuitry, it should be pointed out that the left spare column 22 may replace a column of cells in the left memory array 10 or in the right memory array 12. The right spare column 24 may do likewise.

Figure 2:
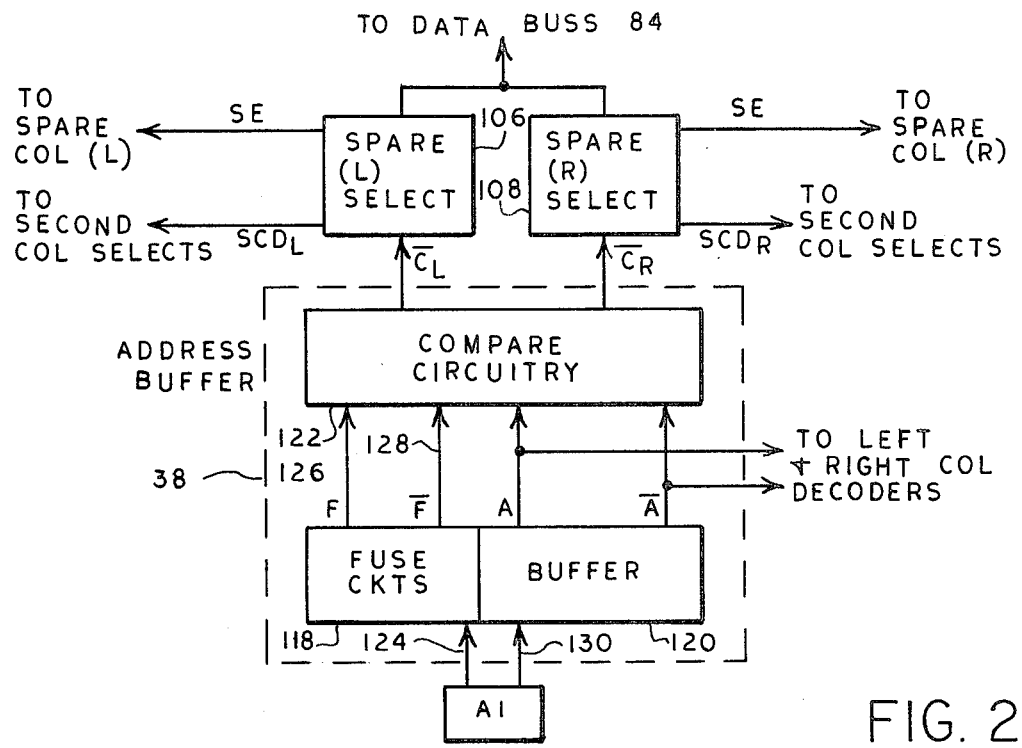
FIG. 2 is a block diagram showing functionally how a defective memory cell is identified and replaced by a spare memory cell.

Referring now to FIG. 2, a functional diagram of the column address buffer 38 is shown. The buffers 40-46 are of similar construction. As shown, the buffer 38 includes fuse circuits 118, an internal buffer 120, and compare circuitry 122.

The fuse circuits 118 essentially contain data indicative of the addresses of two possibly defective columns of cells. That data is fused into the circuit 118 during testing of the chip by the manufacturer. A lead 124 carries a column address bit from input pin A1 for storing the fused data during the chip test. After testing and fusing, any bit appearing on the lead 124 has no effect.

Another pair of leads 126 and 128 carry address information F and $\overline{F}$ of a column of cells on the chip which was determined to be defective during testing, and that information is coupled to the compare circuitry 122.

The internal buffer 120 receives a column address bit via a lead 130 from the pin A1 and outputs true (A) and complimentary ($\overline{A}$) column address data to the left and right column decoders 56 and 58 and to the compare circuitry 122.

The compare circuit 122 compares the column address data A and $\overline{A}$ with the fuse data F and $\overline{F}$ appearing on leads 126 and 128. When the compare circuitry senses that the column address data received from the buffer 120 corresponds to the fuse data F and $\overline{F}$, it outputs a low level signal $\overline{CL}$ and $\overline{CR}$, depending on whether a cell in the left spare column or the right spare column is to replace the defective column of cells to which access is being attempted. If the signal $\overline{CL}$ goes low, the spare left select 106 is enabled for applying a select signal (SE) to the left spare column 22. The left spare select also generates a disable signal $SCD_L$ for disabling the four second column selects. If the signal $\overline{CR}$ goes low, the spare right select 108 selects the right spare column 24 and disables the four second column selects by a disable signal $SCD_R$.

It should be pointed out that each fuse circuit 118 actually includes a pair of fuse circuits, each of which may store fuse data relating to a column of memory cells in either the left memory array 10 or in the right memory array 12. The details of this arrangement are shown in FIG. 3, to which reference is now made.

Figure 3:
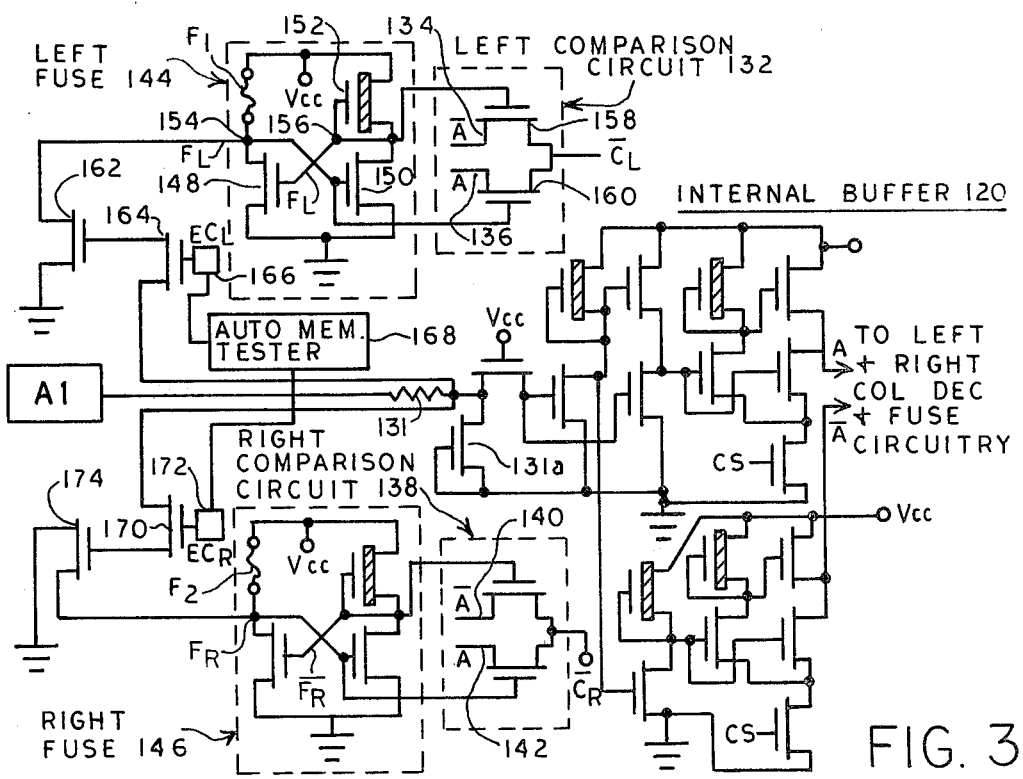
FIG. 3 is a circuit diagram of the fuse circuitry, comparison circuitry and buffer circuitry shown in FIG. 2.

FIG. 3 shows the circuit details of column address buffer 38. The same construction is preferably used for column address buffers 40-46. As shown, the column address buffer includes the internal buffer 120 which may be of the exemplary contruction shown. Suffice it to say that the buffer 120 receives a column address bit from pin A1 via an input protection resistor 131 and an input protection transistor 131a and converts it to true and complimentary column address data A and $\overline{A}$. The latter data is, of course, applied to the left and right column decoders 56 and 58. It is also applied to a left comparison circuit 132 at leads 134 and 136 and to a right comparison circuit 138 at leads 140 and 142. The comparison circuits 132 and 138 correspond to the comparison circuit 122 of FIG. 2.

Also shown is a left fuse circuit 144 and a right fuse circuit 146 which together correspond to the fuse circuitry 118 of FIG. 2. Referring first to the left fuse circuit 144, it includes a fused bi-stable flip-flop comprising enhancement mode transistors 148 and 150, a depletion mode load transistor 152, and a fuse F1 coupled in circuit to act as another load. The fuse F1 and the transistor 152 are selected such that the flip-flop has one stable permanent state when the fuse F1 is blown, and a second, opposite permanent state when the fuse F1 is not blown. This is preferably accomplished by causing the fuse F1 to have an impedance which is much less than the impedance of transistor 152 when the fuse F1 is not blown. For this purpose, the fuse F1 may be a narrow strip of polysilicon which is approximately 2 microns wide and which is designed to blow when it carries approximately 30 milliamperes of current.

Thus, when the fuse F1 is not blown, the junction between the fuse F1 and the transistor 148 (node 154) will power up to a higher voltage than the junction between transistors 150 and 152 (node 156) when the supply voltage $V_{cc}$ is applied. Consequently, the transistor 150 turns on, the node 156 is pulled low, and the transistor 148 is turned off. The voltages at nodes 154 and 156 constitute the output of the flip-flop and are identified as FL and $\overline{FL}$. Hence, with the fuse F1 not blown, the output $\overline{FL}$ is low and the output FL is high. Both such outputs remain in this state unless the fuse F1 becomes blown during testing as described hereinafter.

The outputs of the fuse circuit 144 (FL and $\overline{FL}$) are coupled to transistors 158 and 160. As shown, the transistor 158 receives the output $\overline{FL}$ at its gate and the transistor 160 receives the output FL at its gate. In addition, the source of transistor 158 receives the complimentary column address data $\overline{A}$ at lead 134, and the source of transistor 160 receives the true column address data A at lead 136. The drains of transistors 158 and 160 are coupled together to develop an output signal CL for use in identifying when access to a defective cell is being attempted.

Control over the status of the fuse F1 and the state of the output signal CL is effected by coupling the node 154 to the drain of a fuse-blowing transistor 162 whose source is grounded. The gate of transistor 162 is coupled to the drain of another transistor 164. The source of the transistor 164 is coupled to the address input pin A1 via the input protection resistor 131 and the input protection transistor 131a and its gate is coupled to a pad 166 which is on the chip but not brought out of the chip's package as a pin. In other words, the pad 166 is accessible only during chip probe testing prior to the chip being packaged.

During testing of the chip, an automatic memory tester 168 is coupled to the pad 166 and to corresponding pads in the other column address buffers 40-50. (The second column address buffers 48 and 50 are similar to the buffers 38-46 except that their A and $\overline{A}$ outputs are applied to the second column selects 64, 68, 72 and 76 rather than the left and right column decoders). As is conventional, during the probe test, inputs are applied (not shown) to the RAM and the RAM's outputs are sensed to determine if the RAM is operating properly. For example, the automatic memory tester may provide row and column address bits to the RAM for testing a cell in either the left or right memory array. If that cell is found to be defective, a high level signal is applied to either of the pads denoted ECL and ECR in FIG. 3.

A combination of high and low logic levels corresponding to the address of the defective column are applied to pins A1–A7 (FIG. 1) during probe test. Assume that the column address of the cell being tested requires a high level signal at pin A1. In that case, the transistor 164 is turned on by a high level signal ECL at pad 166 for passing to the transistor 162 the high level signal at pin A1. Hence, the transistor 162 is turned on and provides a path for current from the supply voltage $V_{cc}$, through the fuse F1, and to ground through the transistor 162. The resulting current blows the fuse F1. Consequently, the impedance of the fuse F1 becomes much greater than that of the transistor 152, whereupon the voltage at node 156 rises, the transistor 148 turns on, and the voltage at node 154 goes low. This causes the output FL to be low and the output $\overline{FL}$ to be high. Thus, $\overline{FL}$ being high and FL being low signifies that the fuse F1 is blown. The opposite state always exists when the fuse is not blown. Note, however, that once the fuse F1 has been blown, the outputs $\overline{FL}$ and FL cannot change states. After testing, pad 166 will not again receive a high level signal for turning on the transistor 164. Thus, once testing is complete, the signals FL and $\overline{FL}$ are frozen to whatever state they acquired during the test procedure.

During normal, post-testing operation of the RAM, each signal developed by the internal buffer 120, i.e., the column address data A and $\overline{A}$, is compared to the fuse data FL and $\overline{FL}$ to determine if the address signified by A and $\overline{A}$ corresponds to the address of a cell in a defective column.

As a result of the arrangement described above, the fuse-blowing transistor 162 steers fuse-blowing current to ground rather than to the memory address input A1. Hence, test equipment which is coupled to the input A1 need not be capable of handling the fuse-blowing current. In addition, the input protection resistor 131 and transistor 131a prevents voltage spikes from being coupled from the input pin A1 to the transistor 166, thereby protecting the latter transistor while simultaneously providing input protection for the buffer 120.

Referring now more specifically to the comparison circuitry 132, the preferred arrangement shown therein illustrates that a transistor whose source receives the true address data (A) receives the complimentary fuse data ($\overline{FL}$) at its gate. Likewise, the transistor whose source receives the complimentary address data ($\overline{A}$) receives the true fuse data (FL) at its gate. Thus, when the fuse F1 has been blown and the buffer 38 receives a high column address bit at pin A1, column address data $\overline{A}$ will be high, A will be low, $\overline{FL}$ will be high and FL will be low. Consequently, the transistor 160 is off and transistor 158 is on to couple the low $\overline{A}$ to the drain of transistor 158. Hence, the output signal $\overline{CL}$ goes low to indicate that the incoming column address may be that of a column having a defective memory cell.

It should be noted that the fuse F1 need not be blown in order to drive $\overline{CL}$ low. For example, if a defective memory cell were identified during chip test, and ECL went high while the input at pin A1 was low, the fuse F1 would not blow. Nevertheless, if the input at pin A1 goes low after testing is complete, $\overline{CL}$ will be driven low because the transistor 160 receives a high level FL signal at its gate and a low level signal A at its source. Hence, the illustrated arrangement provides correct identification of a defective memory cell, irrespective of whether the address bit of that particular cell is a high or a low at pin A1.

It will be appreciated that the column address buffers 40-50 are also developing outputs corresponding to $\overline{CL}$. However, it is only all seven such $\overline{CL}$ outputs being low that indicates that the incoming column address information is attempting to access a memory column which has a defective cell. Anything less than seven low $\overline{CL}$ outputs from the column address buffers results in no spare column being selected.

Referring now to the bottom of FIG. 3, it can be seen that the right fuse circuit 146 and the right comparison circuitry 138 is constructed in the same manner as the left fuse circuit 144 and the left comparison circuitry 132. A transistor 170 is included to receive from an internal pad 172 a high level signal ECR when the probe test locates an additional defective cell(s) in another column. When a high logic level on pin A1 corresponds to the column address of the defective memory cell, pin A1 is forced high. ECR is also forced high, and the transistor 170 conducts to couple the high at pin A1 to the gate of another transistor 174. The latter transistor conducts to complete a path for current from the supply voltage $V_{cc}$, through a fuse F2 and to ground through the transistor 174. Hence, the fuse F2 blows and the outputs $\overline{FR}$ and FR are driven high and low, respectively.

The comparison circuit 138 operates in a manner similar to that of comparison circuitry 132 so as to generate a low level output signal $\overline{CR}$ whenever the address bit received at pin A1 constitutes the address of a defective cell.

Note that, after testing, each time the pin A1 receives a high level bit, the output signals $\overline{CL}$ and $\overline{CR}$ are both driven low if the fuses F1 and F2 had been previously blown. Of course, if only the fuse F1 had been blown, only $\overline{CR}$ would be driven low.

It should be noted that the data FL and $\overline{FL}$ are generated in a manner such that that data is continuously available for comparison with incoming memory address information. Stated another way, the data FL and $\overline{FL}$ is generated asynchronously (i.e., it is not clocked) so that comparison with incoming memory address information can begin immediately, thereby reducing the time required for read and write operations.

Figure 4:
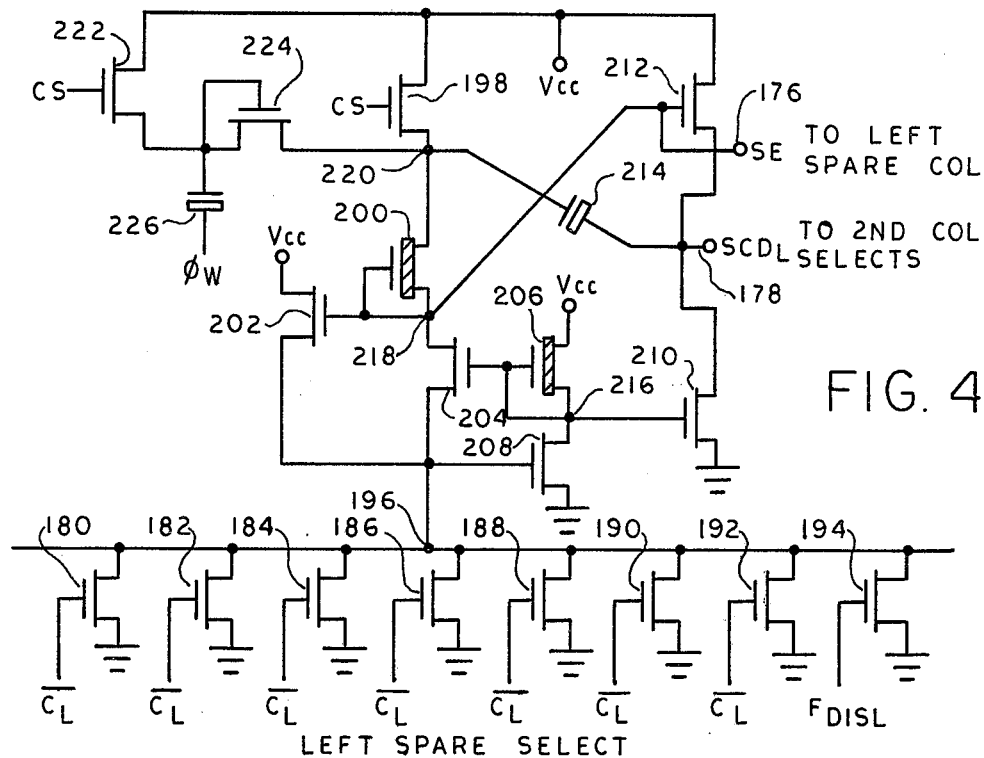
FIG. 4 is a circuit diagram of the left spare select circuitry of FIG. 1.

Referring now to FIG. 4, circuit details of the left spare select 106 are shown. This circuit receives seven $\overline{CL}$ inputs from the seven column address buffers 38-50 and a signal $F_{DISL}$ from the spare disable circuit 117 (FIG. 1). When one or more of the $\overline{CL}$ inputs are high, this is indicative that the cell being addressed is not defective, whereupon the spare select causes its output signal SE at lead 176 to go low for disabling the left spare column 22, and causes its other output $SCD_L$ at lead 178 to go low. The latter output is coupled to the second column selects (FIG. 1) to permit them to operate normally. If during test no memory cell is found to be defective, the spare disable 117 causes the signal $F_{DISL}$ to be permanently high so as to maintain the signals SE and SCD in a permanently low state.

More specifically, the seven $\overline{CL}$ signals are applied to the gates of seven corresponding transistors 180–192, and the signal $F_{DISL}$ is applied to the gate of a transistor 194. The drains of transistors 180–194 are all coupled to a node 196 whose voltage level is sensed by a bootstrap circuit comprising transistors 198–212 and a capacitor 214. This type of bootstrap circuit is disclosed in U.S. application Ser. No. 172,776 filed July 28, 1980.

If testing of the chip indicated that at least one memory cell was defective, the signal $F_{DISL}$ is fused low to turn off the transistor 194. If a seven bit column address is received corresponding to a defective cell, all the inputs $\overline{CL}$ will be low to turn off transistors 180–192. Thus, no path to ground exists from $V_{cc}$ through transistors 200 and 204 and the node 196. Hence, the potential on node 196 rises and turns on transistor 208. The voltage at the drain of transistor 208 (node 216) drops and turns transistors 204 and 210 off and causes the voltage at the drain of transistor 204 (node 218) to rise. Consequently, transistor 212 turns on and the signal SE at lead 176 rises. The voltage on lead 178 (SCD) also rises, and the latter voltage rise is coupled via the capacitor 214 to node 220. The depletion mode transistor 200 couples the voltage rise at node 220 to node 218, thus causing transistor 212 to conduct harder.

This regenerative cycle continues until, in the case where $V_{cc}$ is 5 volts, the signal SLD rises to 5 volts, and the signal SE is bootstrapped to about 7 volts. Thus, the high level signal SE causes the left spare column to be enabled and the high level signal SCD causes the second column selects to be disabled. Of course, when any one or more of the $\overline{CL}$ inputs are high, the node 196 is pulled to ground and the signals SE and SCD are driven low. In the latter case, no spare column selection takes place.

The bootstrap circuit may also include a charge pump defined by transistors 222 and 224 and a capacitor 226. When the chip is in its active mode, a chip select signal (CS) turns the transistor 222 on. A five megahertz square wave pulse $\phi W$, derived from the $V_{bb}$ generator 100 (FIG. 1), is applied to the capacitor 226. With this arrangement, a periodic trickle of charge is applied by transistor 224 to node 220 to maintain node 220 at a high voltage level indefinitely, if necessary.

The right spare select 108 (FIG. 1) may be constructed similarly to the left spare select shown in FIG. 4, except that the $\overline{CL}$ inputs shown in FIG. 4 are replaced by the $\overline{CR}$ signals developed by the column address buffers 38–50. Also $F_{DISL}$ is replaced by $F_{DISR}$.

Figure 5:
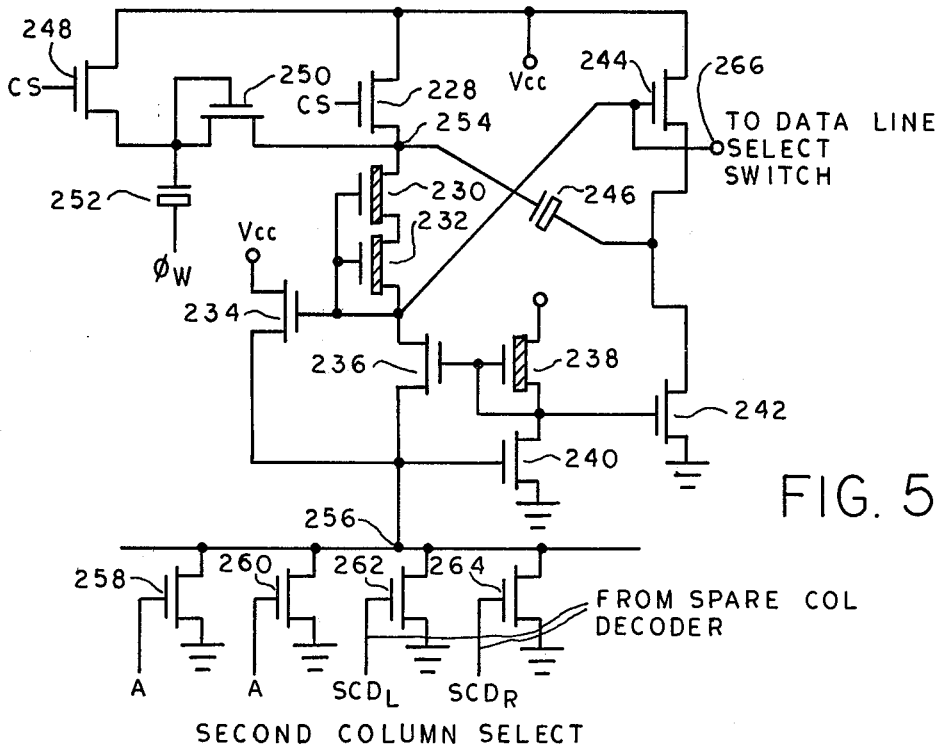
FIG. 5 is a circuit diagram of one of the second column selects shown in FIG. 1.

As mentioned above, each of the spare column selects 106 and 108 generates spare column enable signals (SE) when a spare column is to be selected, and they generate disable signals ($SCD_L$ and $SCD_R$) for disabling the four second column selects at the same time. FIG. 5 illustrates an exemplary second column select and the way in which it may be disabled.

As shown, the second column select may include transistors 228–244 and a capacitor 246, all interconnected as a bootstrap circuit of the type shown in FIG. 4. A charge pump comprising transistors 248 and 250 and a capacitor 252 may be included for holding the node 254 high for as long as necessary.

Coupled to a node 256 are a pair of transistors 258 and 260 for receiving column address inputs from the second column address buffers 48 and 50 (FIG. 1). Another pair of transistors 262 and 264 are also coupled to the node 256 and receive the disable signals $SCD_L$ and $SCD_R$ which are generated by the left spare select 106 and the right spare select 108, respectively. When the disable signals $SCD_L$ and $SCD_R$ are both low, the illustrated second column select is enabled for generating a high level signal at an output terminal 266 when the column address inputs received by transistors 258 and 260 are low. As described in more detail below, the high level signal at terminal 266 enables a pair of data line select transistors for coupling a pair of data lines such as data line pair 66 of FIG. 1 to the data buss 84.

When either of the disable signals $SCD_L$ or $SCD_R$ go high, the node 256 is pulled low. Consequently, the node 266 is pulled low to turn off the data line select transistors mentioned above.

Each of the second column selects 64, 68, 72 and 76 is preferably constructed as shown in FIG. 5. In addition, the left and right column decoders 56 and 58 may each include 32 individual decoders which may be conventional or constructed as shown in FIG. 5, except that the individual column decoders receive only column address data at a node corresponding to node 256 in FIG. 5. No disabling signals are applied to the corresponding node.

Figure 6:
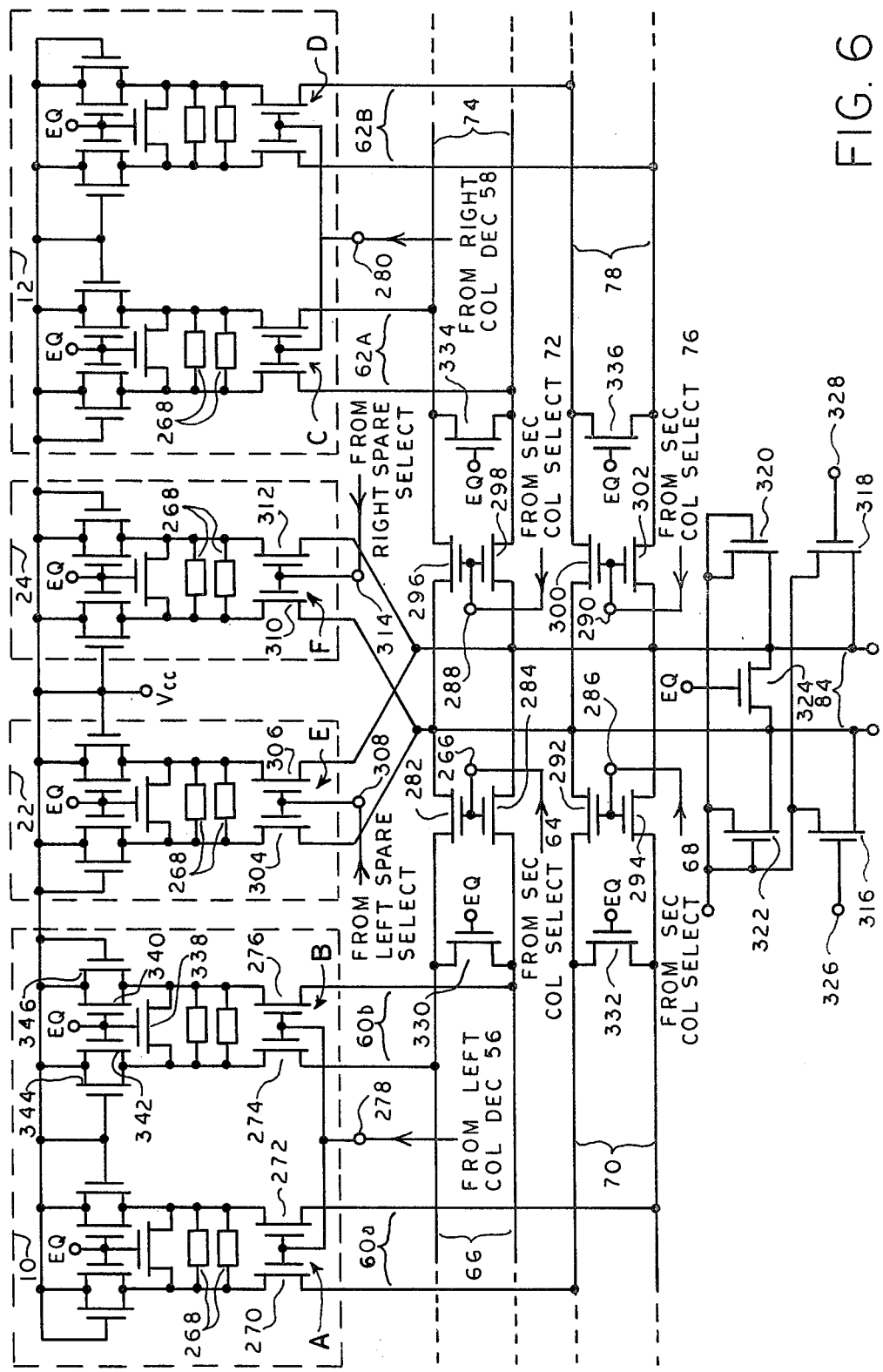
FIG. 6 illustrates details of the memory accessing circuitry for the main memory arrays and the spare columns of memory cells.

Referring now to FIG. 6, the details are shown of the way in which the left and right column decoders 56 and 58, the second column selects 64, 68, 72 and 76, and the left and right spare selects access particular columns of memory cells. Shown are two columns A and B of memory cells 268 associated with the left memory array 10. Actually, the left memory array includes 64 such columns with 128 memory cells in each column. Each of the cells 268 may consist of a pair of transistors and a pair of polysilicon resistors interconnected as a flip-flop.

Columns C and D are two of the 64 columns of memory cells associated with the right memory array 12. Columns E and F of memory cells correspond, respectively, to the left spare column 22 of memory cells and the right spare column 24 of memory cells shown in FIG. 1.

Referring first to columns A and B, they each include a pair of bit lines 60a and 60b. The bit lines 60a are coupled to each memory cell 268 in column A and to a pair of transistors 270 and 272. Similarly, the bit lines 60b are coupled to each memory cell in column B and to another pair of transistors 274 and 276. The gates of transistors 270–276 are coupled to a common terminal 278 to receive a high level select signal from the left column decoder 56. When such a signal occurs, the transistors 270–276 are turned on for coupling data on the bit lines 60a and 60b to data lines 66 and 70. In like manner, bit lines 62a and 62b in columns C and D are coupled to data lines 74 and 78 when a select signal is received at terminal 280 from the right column decoder 58.

To reduce the data received from four columns to one column, each of the data lines 66, 70, 74 and 78 includes its own selecting transistors which are enabled by high level signals from the second column selects 64, 68, 72 and 76 (FIG. 1). Specifically, data lines 66 are coupled as shown with transistors 282 and 284, the gates of which are coupled to the terminal 266 which is also shown in FIG. 5. Data lines 70, 74 and 78 are coupled to terminals 286, 288 and 290, respectively, via the transistors 292-302.

Depending on the column address received by the RAM, one of the second column selects 64, 68, 72 or 76 (FIG. 1) will apply a high level signal to one of the terminals 266, 286, 288 and 290, thereby causing one of the pairs of data lines to be coupled to the data buss 84 for reading data from the selected memory cell or for writing data into it.

Although no word (row select) lines are shown in FIG. 6, it will be appreciated that, in practice, such will be included in order to select the proper memory cell for coupling to the data buss 84.

Referring to columns E and F of FIG. 6, each such column includes memory cells 268. To access the memory cells in column E, the left spare select 106 (FIGS. 1 and 4) generates a high level signal SE at its output for application to a pair of transistors 304 and 306 via a terminal 308. When the terminal 308 is driven high, the transistors 304 and 306 conduct to couple the memory cells in column E to the data buss 84.

The right spare column of memory cells is accessed by another high level signal generated by the right spare select 108 and applied to a pair of transistors 310 and 312 via a terminal 314. Hence, when the latter transistors conduct, the memory cells in column F are coupled to the data buss 84.

The data buss 84 may also be coupled to five additional transistors 316, 318, 320, 322 and 324. The sources of transistors 316 and 318 are coupled to either side of the buss 84, and their gates receive signals at terminals 326 and 328 which cause transistors 316 and 318 to be turned on during the RAM's read mode to limit the negative voltage excursion on the buss line to two threshold drops below $V_{cc}$. The transistors 316 and 318 are turned off during the write mode.

Transistors 320 and 322 have their sources coupled to the data buss and their gates coupled to their drains so that, when the potential on the data buss drops more than a threshold voltage ($V_t$) below $V_{cc}$, transistors 320 and 322 turn on to reduce the negative-going voltage swing on the data buss. The data line pairs 66, 70, 74 and 78 may also have devices similar to transistors 316, 318, 320 and 322 for performing the functions stated above.

The transistor 324 is coupled via its drain to one side of the data buss and via its source to the other side of the data buss. The gate of the transistor 324 receives the signal EQ developed by the clock generator 28 (FIG. 1) for shorting together and equilibrating opposite sides of the data buss in a manner described in U.S. application Ser. No. 164,283, filed June 30, 1980.

The data line pairs 66, 70, 74 and 78 also include transistors 330, 332, 334 and 336, as shown, for recieving the signal EQ to equilibrate the data lines to which they are coupled.

The upper ends of each memory column A-F may be coupled to three transistors for equilibrating and precharging the bit lines associated with each column as described in the application identified above. For example, the bit lines 60b of column B may be coupled to a transistor 338 for shorting together the bit lines 60b in response to the signal EQ, and may be coupled to transistors 340 and 342 for being pre-charged in response to the same signal. The other columns are similarly connected to their own transistors for effecting the equilibration and precharging functions.

Also shown coupled to the upper ends of memory column B is a pair of transistors 344 and 346 which act as "keepers" to provide a trickle of charge to the bit lines 60b to compensate for charge leakage therefrom. Columns A and C-F include similar "keepers".

Figure 7:
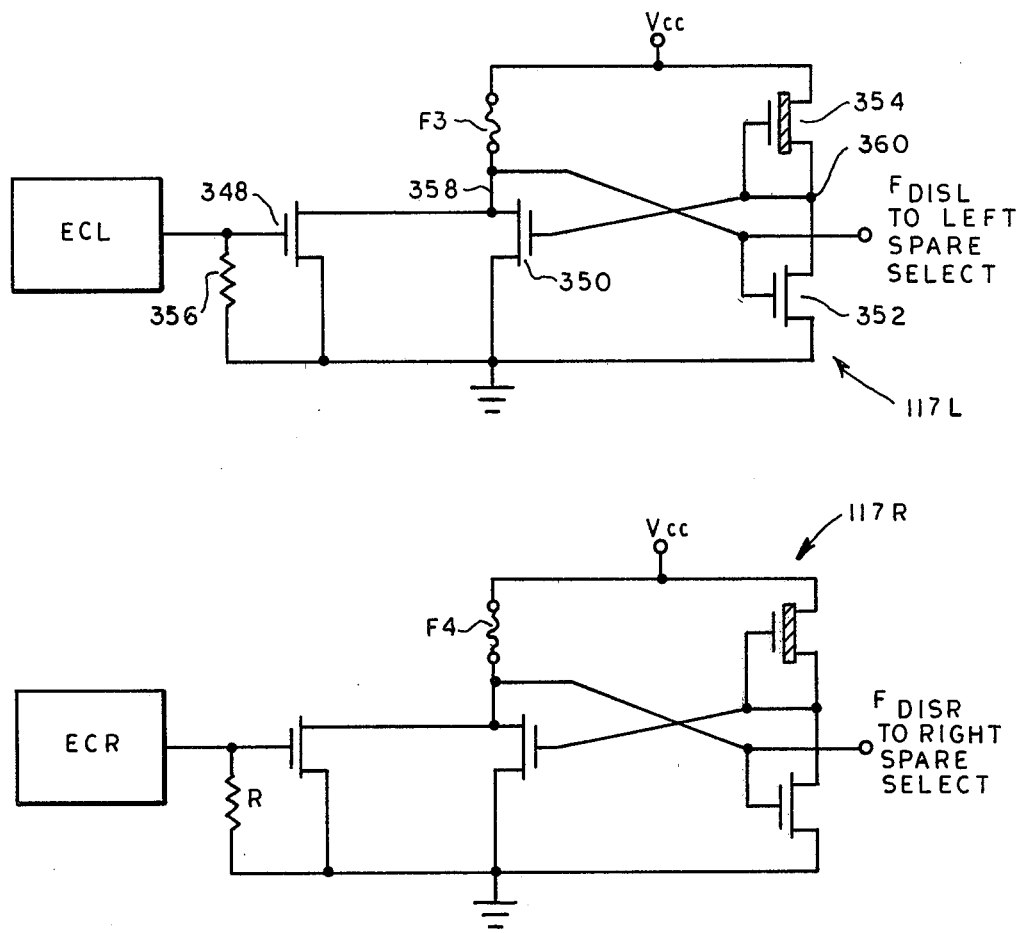
FIG. 7 is a circuit diagram of the spare disable circuits of FIG. 1.

As stated previously, the spare selects 106 and 108 are both preferably permanently disabled when chip testing reveals no defective memory cells. The spare disable circuits 117 shown in detail in FIG. 7 provide this function.

As shown, the spare disable circuits include identical circuits 117L and 117R. The circuit 117L generates a high level signal $F_{DISL}$ to disable the left spare select 106 when no defective memory cells are found during testing. Likewise, the circuit 117 generates a high level signal $F_{DISR}$ to disable the right spare select 108 when no defective memory cells are found.

Referring to the circuit 117L, it includes a fuse F3, enhancement mode transistors 348, 350 and 352, a depletion mode transistor 354 and a polysilicon resistor 356. The gate of the transistor 348 and the ungrounded end of the resistor 356 are coupled to the internal pad identified as ECL which receives a high level signal during the probe test when a defective memory cell is found.

The fuse F3 is made of polysilicon material such than its impedance is much lower than the impedance of transistor 354 when the fuse F3 is not blown. Hence, the flip-flop circuit comprising transistors 350-354 and the fuse F3 powers up prior to testing such that node 358 is high and the node 360 is low. Hence the signal $F_{DISL}$ is also high.

Should a defective memory cell be found during the probe test, the high level signal is applied to the internal pad ECL to turn on the transistor 348. Consequently, a current path is established from $V_{cc}$ to ground through the fuse F3 and transistor 348. The flow of current thus established causes the fuse F3 to blow and the flip-flop to change states.

The node 358 is now pulled low, causing the transistor 352 to turn off and pull node 260 high. The transistor 350 turns on and the signal $F_{DISL}$ is pulled low.

As shown in FIG. 4, $F_{DISL}$ being low turns off the transistor 194 to permit the node 196 to go high for enabling the left spare select. Of course, the fact that the fuse F3 is blown ensures that the signal $F_{DISL}$ remains low so that the left spare select may be enabled by the signals $\overline{CL}$ received from the compare circuits shown in FIG. 3.

Had the probe test found no defective memory cells, $F_{DISL}$ would have remained high to maintain the transistor 194 in a permanently on condition, thus permanently disabling the left spare select.

To ensure that the status of the circuit 117L is not disturbed during normal chip operation, the polysilicon resistor 356 couples the pad ECL to ground so that the transistor 348 cannot be turned on by any charge which may accumulate at the ECL pad.

The circuit 117R includes a fuse F4 and is identical in construction to the circuit 117L. Suffice it to say that the fuse F4 blows and the circuit 117R generates a low level signal $F_{DISR}$ when a high level signal is applied at the internal pad ECR. Consequently, the right spare select 107 is enabled. If the pad ECR is not driven high, the fuse F4 remains unblown and the signal $F_{DISR}$ remains high to permanently disable the right spare select 108.

The redundancy scheme described above does away, of course, with the need for a laser by employing fused circuitry which is blown electrically and automatically during chip test. Further, the circuitry employed to effect redundancy is relatively simple, requiring only about 2% of the chip's total area.

A further advantage of the present redundancy scheme is that the chip's power dissipation is increased by less than 8 milliwatts, and the yield of the chip is thought to be at least twofold.

Another advantage of the present system is that a defect which occurs at the common boundary of a pair of adjacent memory cell columns can be repaired by substituting a pair of spare memory columns for the adjacent memory cell columns wherever the latter may be located on the chip. Of course, the invention may also be practiced by substituting spare memory rows for defective memory rows in the manner described above. That is, any type of defective memory array, row or column, may be repaired by the present redundancy scheme.

Although the redundancy scheme has been described in terms of a preferred structure, it will be obvious to those skilled in the art that many modifications and alterations may be made without departing from the invention. Accordingly, it is intended that all such modifications and alterations be included within the spirit and scope of the invention as defined by the appended claims.

What is claimed is:

1. In an MOS memory chip having an array of memory cells adapted to be tested by a probe test operation which identifies defective memory cells and generates a signal for use in replacing defective memory cells, a redundancy scheme for substituting spare memory cells for cells found to be defective by the probe test, comprising:
   a plurality of spare memory cells;
   on-chip address control means electrically responsive to the signal generated during probe test for permanently storing and for rendering continuously available a fully asynchronous electrical indication of the addresses of defective memory cells, for comparing incoming memory address information received after testing with the address of defective memory cells, and for generating a control signal indicative of the receipt of memory address information corresponding to the address of a defective memory cell; and
   selection means responsive to the control signal for electrically accessing a spare memory cell and for prohibiting access to the defective memory cell.

2. A redundancy scheme as set forth in claim 1 wherein said address control means includes fuses adapted to be electrically blown in response to the probe test locating at least one defective memory cell for generating asynchronously available information indicative of the address of a defective memory cell.

3. A redundancy scheme as set forth in claim 2 wherein said address control means asynchronously compares the defective memory cell address information with incoming memory cell addresses.

4. A redundancy scheme as set forth in claim 3 wherein said selection means is adapted to be permanently disabled in response to the probe test finding no defective memory cells.

5. A system as set forth in claim 2 wherein said address control means further includes a fuse-blowing transistor coupled between ground and a fuse and adapted to be turned on for coupling fuse-blowing current through the fuse to ground, and another transistor having a gate adapted to receive the signal generated during probe test and having a source adapted to receive, from a memory address input pin, memory address information for turning on the fuse-blowing transistor so as to steer fuse-blowing current to ground rather than to the memory address input pin.

6. A system as set forth in claim 2 further including an input pin for coupling address information to the chip memory, and including input protection circuitry coupled between said input pin and said address control means.

7. A redundancy scheme as set forth in claim 2 wherein said address control means includes a plurality of bi-stable flip-flops, each of whose states is controlled by one of said fuses such that a blown fuse drives its associated flip-flop to a first permanent state and an unblown fuse holds its associated flip-flop in a second permanent state.

8. A redundancy scheme as set forth in claim 7 wherein each flip-flop includes a pair of interconnected enhancement mode transistors, one of said transistors having a depletion mode transistor for a load and the other of said transistors having a fuse for a load, the fuse being selected such that its unblown impedance is much less than the impedance of the depletion mode transistor.

9. A redundancy scheme as set forth in claim 8 wherein each fuse is constructed of polysilicon material.

10. A redundancy scheme as set forth in claim 1 including a spare disable circuit responsive to the probe test finding no defective memory cells for disabling said selection means.

11. A redundancy scheme as set forth in claim 10 wherein said spare disable circuit includes a fuse adapted to be electrically blown for permanently permitting enablement of said selection means.

12. A redundancy scheme as set forth in claim 11 wherein said spare disable circuit includes a flip-flop whose state is controlled by a fuse such that a blown fuse permanently drives the flip-flop to a first state for permanently enabling said selection means, and an unblown fuse drives the flip-flop to a second state for permanently disabling said selection means.

13. A redundancy scheme as set forth in claim 12 wherein the flip-flop in said spare disable circuit includes a pair of interconnected enhancement mode transistors, one of said transistors having a depletion mode transistor for a load and the other having a fuse for a load, the fuse being selected such that its unblown impedance is much less than the impedance of the depletion mode transistor.

14. In an MOS memory chip having an array of memory cells adapted to be tested by a probe test operation which identifies defective memory cells and generates a signal for use in replacing defective memory cells, an on-chip redundancy scheme for substituting spare memory cells for cells found to be defective by the probe test, comprising:
   buffer means adapted to receive column address information developed externally of the memory for generating corresponding column address data;
   main selection means for accessing the main array of cells in response to column address data generated by said buffer means;
   a pair of spare columns of memory cells;

address storing means electrically responsive to the probe test finding at least one defective cell in a main column of cells for permanently storing and for rendering asynchronously available the address of that defective main column of cells;

comparator means for comparing the column address data generated by said buffer means to the permanently stored address of the defective column of cells, and for generating a control signal when said comparison indicates that the column address data corresponds to the permanently stored data; and spare selection means responsive to the control signal for disabling said main selection means and for substituting one of said spare columns of memory cells for the defective column.

15. A redundancy scheme as set forth in claim 14 further including one or more internal on-chip pads for coupling the signal generated during probe test to said address storing means.

16. In an MOS memory chip having an array of memory cells adapted to be tested by a probe test operation which identifies defective memory cells and generates a signal for use in replacing defective memory cells, a redundancy scheme for substituting spare memory cells for cells found to be defective by the probe test, comprising:

buffer means adapted to receive column address information developed externally of the memory for generating corresponding column address data;

main selection means for accessing the main array of cells in response to column address data generated by said buffer means;

a pair of spare columns of memory cells;

address storing means electrically responsive to the probe test finding at least one defective cell in a main column of cells for permanently storing and for rendering asynchronously available the address of that defective main column of cells;

one or more internal on-chip pads for coupling the signal generated during probe test to said address storing means;

comparator means for comparing the column address data generated by said buffer means to the permanently stored address of the defective column of cells, and for generating a control signal when said comparison indicates that the column address data corresponds to the permanently stored data;

spare selection means responsive to the control signal for disabling said main selection means and for substituting one of said spare columns of memory cells for the defective column; and one or more spare disable circuits coupled to said pad(s) and to said spare selection means for disabling said spare selection means when the probe test finds no defective memory cells.

17. A redundancy scheme as set forth in claim 16 wherein said address storing means includes fuses adapted to be electrically blown in response to the probe test locating at least one defective memory cell so as to generate continuously available fuse data indicative of the column address of the defective memory cell, and wherein said comparator means compares the fuse data with the column address data generated by said buffer means.

18. A redundancy scheme as set forth in claim 16 wherein said address storing means includes a plurality of flip-flops each associated with a fuse, each of said flip-flops corresponding to one bit of column address information and being coupled with its associated fuse such that, when its fuse is blown, the flip-flop is driven to a first permanent state, and, when its fuse is not blown, the flip-flop is held in a second, opposite permanent state.

19. A redundancy scheme as set forth in claim 17 wherein said spare disable circuit includes a flip-flop connected with a fuse such that the fuse is adapted to blow when a defective memory cell is found to drive the flip-flop to a permanent state in which it enables said spare selection means.

20. In an MOS memory chip having an array of memory cells adapted to be tested by a probe test operation which identifies defective memory cells and generates a signal for use in replacing defective memory cells, a redundancy scheme for substituting spare memory cells for cells found to be defective by the probe test, comprising:

a plurality of column address buffers each adapted to receive a bit of column address information developed externally of the memory for generating corresponding bits of column address data;

main selection means for accessing the main array of cells in response to column address data generated by said column address buffers;

a pair of spare columns of memory cells;

a pair of internal pads for receiving during the probe test the signal indicative of the presence of at least one defective cell in the main array of cells;

first and second fuse circuits and compare circuits associated with each column address buffer, each of said fuse circuits including a flip-flop whose states are controlled by a fuse coupled to an internal pad so that the fuse becomes blown when a defective memory cell is located by the test probe and the flip-flop is permanently driven to a state indicative of a blown fuse;

each of said compare circuits being coupled to the output of its associated fuse circuit and column address buffer for generating a signal indicating that the received column address bit constitutes a portion of the address of a defective memory cell;

first and second spare select circuits responsive to the signal outputs of said comparison circuits for accessing one of said spare columns and for disabling said main selection means; and a spare disable circuit coupled to said pads and to said spare select circuits, said spare disable circuit including a flip-flop whose state is controlled by a fuse such that a blown fuse permanently drives the flip-flop to a first state for permanently enabling said spare select circuits, and an unblown fuse drives the flip-flop to a second state for permanently disabling said spare select circuits.

21. A redundancy scheme as set forth in claim 20 wherein each of said column address buffers generates true and complimentary bits of column address data, wherein each of said fuse circuits generates true and complimentary fuse output data, and wherein each of said compare circuits includes a first transistor receiving the complimentary column address data at its source and receiving the true fuse output data at its gate, and a second transistor receiving the true column address data at its source and the complimentary fuse data at its gate, the drains of said first and second transistors being coupled to a common output terminal.

22. In an MOS memory chip having an array of memory cells adapted to be tested by a probe test operation which identifies defective memory cells and generates a signal for use in replacing defective memory cells, a redundancy scheme for substituting spare memory cells for cells found to be defective by the probe test, comprising:

a plurality of spare memory cell arrays;

on-chip means electrically responsive to the signal generated during probe test for storing an electrical indication of the addresses of defective memory cell arrays, for asynchronously comparing incoming memory address information received after testing with the addresses of the defective memory cell arrays, and for generating control signals indicative of the receipt of memory address information corresponding to the addresses of defective memory cell arrays; and means responsive to the control signals for substituting at least two spare memory cell arrays for a pair of defective memory cell arrays wherever the latter may be located on the chip, to thereby correct a defect which may occur at the common boundary of a pair of adjacent memory cell arrays.

* * * * *